United States Patent
Lee et al.

[11] Patent Number: 5,840,611
[45] Date of Patent: Nov. 24, 1998

[54] PROCESS FOR MAKING A SEMICONDUCTOR MOS TRANSISTOR

[75] Inventors: Chang-Jae Lee; Jae-Jeong Kim, both of Cheongju-si, Rep. of Korea

[73] Assignee: Goldstar Electron Company, Ltd., Chungcheongbuk-Do, Rep. of Korea

[21] Appl. No.: 899,396

[22] Filed: Jul. 23, 1997

Related U.S. Application Data

[63] Continuation of Ser. No. 357,952, Dec. 15, 1994, abandoned.

[30] Foreign Application Priority Data

Dec. 16, 1993 [KR] Rep. of Korea ................. 1993 28014

[51] Int. Cl.$^6$ .................................................. H01L 21/336
[52] U.S. Cl. ........................... 438/307; 438/301; 438/585
[58] Field of Search ................................. 438/204, 301, 438/303, 306, 307, 585

[56] References Cited

U.S. PATENT DOCUMENTS

| | | | |
|---|---|---|---|
| 3,906,620 | 9/1975 | Anzai et al. | 437/983 |
| 4,113,515 | 9/1978 | Kooi et al. | 437/41 GS |
| 4,445,266 | 5/1984 | Mai et al. | 437/983 |
| 4,599,118 | 7/1986 | Han et al. | 148/DIG. 82 |
| 5,427,971 | 6/1995 | Lee et al. | 437/44 |

FOREIGN PATENT DOCUMENTS

| | | | |
|---|---|---|---|
| 60-133755 | 7/1985 | Japan | 437/44 |
| 61-121473 | 6/1986 | Japan . | |
| 62-273774 | 11/1987 | Japan . | |
| 63-19874 | 1/1988 | Japan . | |
| 590290 | 4/1993 | Japan | 437/913 |
| 5-267331 | 10/1993 | Japan | 438/204 |

Primary Examiner—Michael Trinh
Attorney, Agent, or Firm—Loudermilk & Associates

[57] ABSTRACT

The present invention provides a process for forming an MOS semiconductor device having an LDD structure, which includes a forming a gate electrode by first etching a conductive layer to a certain depth by an RIE process and by second etching the conductive layer by an isotropic plasma etching process. In forming the source/drain of the device, an $n^+$ source/drain and an $n^-$ source/drain are formed in a sequential manner. The gate line first is formed with its width over-sized compared with its channel length, and finally is formed to its final size.

19 Claims, 8 Drawing Sheets

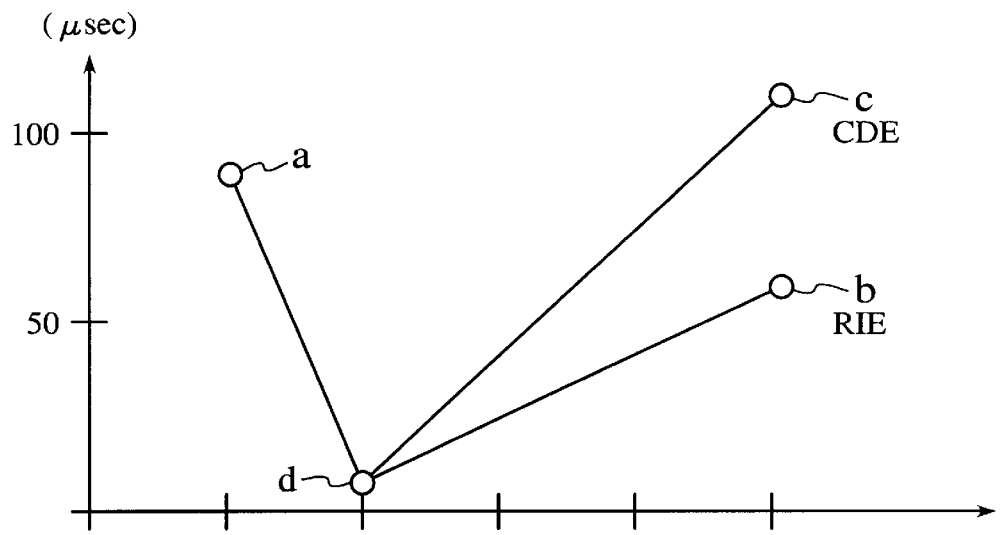
FIG. 3 (PRIOR ART)
Dependence of Junction Leakage on Cleaning Methods
| Etch | Cleaning Method | Junction Leakage (nA at 3.3V) |
| --- | --- | --- |
| Dry + Wet etch | SCI + HF | 4.1 |
| 10% Overetch | SCI + HF | 6.4 |
| 30% Overetch | SCI + HF | 60.0 |
| 30% Overetch | Silicon Light etch + SCI + HF | 4.0 |
FIG. 4 (PRIOR ART)
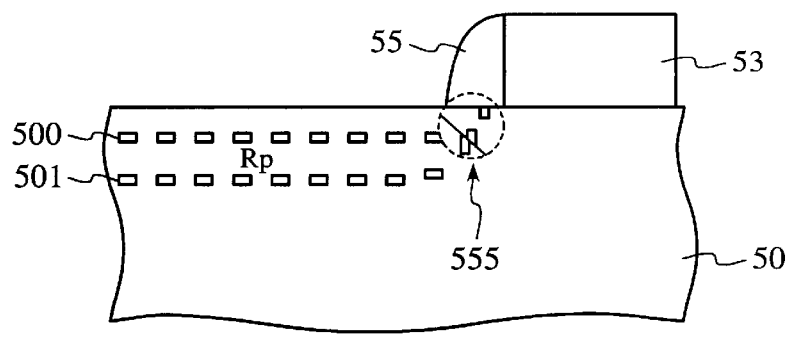
FIG. 5 (PRIOR ART)

PROCESS FOR MAKING A SEMICONDUCTOR MOS TRANSISTOR

"This application is a continuation of application Ser. No. 08/357,952 filed on Dec. 15, 1994, now abandoned"

FIELD OF THE INVENTION

The present invention relates to processes for making semiconductor devices, and more particularly to processes for forming MOS field effect transistors (FETs) having a lightly doped drain (LDD) in a high density device.

BACKGROUND OF THE INVENTION

Generally, a semiconductor integrated circuit requires high circuit performance and high density. Therefore, in the case of a metal oxide semiconductor field effect transistor (or "MOSFET"), the technology for the forming a semiconductor integrated circuit has been scaled down to a sub-micron range as a result of the efforts to reduce the size of the device. Only through a reduction of the horizontal dimension and a proportionate reduction of the vertical dimension, can a functional equilibrium between various devices be achieved. That is, if the distance between the source and drain is reduced as a result of the reduction of the size of the device, an undesirable variation of the characteristics of the device occurs, a typical example being the short channel effect. If this short channel effect is to be overcome, a horizontal scale-down has to be carried out; that is, the gate length has to be reduced. Further, a vertical scale-down has to be carried out; that is, the thickness of the gate insulation dielectrics and the depth of the junction and the like have to be reduced. Further, the applied voltage has to be lowered, and the doping concentration of the semiconductor substrate has to be increased. Particularly, the doping profile for the ion implantation depth of the channel region has to be controlled. The applied voltage for the semiconductor device, however, has to satisfy the power source for the electronic apparatus in which the semiconductor device is used. Therefore, while the dimension of the semiconductor device is scaled down, the electrical dimension for the applied power source of the circuit is not reduced. In the case of a MOS device, particularly in the case of an NMOS transistor, the distance between the source and drain is reduced as a result of the reduction of the channel. Accordingly, the electrons which are supplied from the source are abruptly accelerated by a high electric field near a pinch-off region near the channel of the drain junction, thereby producing hot carriers. Thus, the NMOS transistor is vulnerable to these hot carriers. (Refer to Chenming Hu et al, "Hot-electron-induced MOSFET Degradation Motel, Monitor and Improvement", IEEE Transactions on Electron Devices, Vol. ED32, No. 2, February 1985, pp. 375–385).

According to the above cited paper, the instability of hot carriers is caused by a high electric field near the drain junction, which is caused by the short channel length and the high applied voltage. Hot carriers thus generated are injected into the gate insulating layer, which can result in substrate current. Therefore, an LDD (lightly doped drain) structure was proposed in 1978, which improves the NMOS device which is subject to hot carriers and has a reduced channel length. (Refer to K. Saito et al, "A New Short Channel MOSFET with Lightly Doped Drain", denshi tsushin rengo taikai (in Japanese), April 1978, p. 220).

The LDD structure has characteristics such that the side length is narrow, and a self-aligned lightly doped n⁻ region is disposed between the channel and the highly doped n⁺ source/drain region. This n⁻ lightly doped region spreads out the high electric field near the drain junction, so that carrier electrons supplied from the source are not abruptly accelerated, thereby overcoming the current instability due to hot carriers. Since studies on semiconductor devices of over 1 mega-bit DRAMs have begun, techniques for manufacturing MOSFETs having an LDD structure have been proposed in various forms. Of them, the most typical one is that in which the LDD is formed by providing a side wall spacer on each of the side walls of the gate, and this technique is being used in most mass production devices.

FIG. 1 illustrates a conventional process for forming an NMOS transistor having an LDD structure.

First referring to FIG. 1A, active region 10a and isolated region 10b are formed upon silicon substrate 10. Gate insulating layer 12 is formed on the surface, and polysilicon layer 13' is formed thereupon. Cap gate oxide layer 14' is formed on polysilicon layer 13'.

As illustrated in FIG. 1B, cap gate oxide layer 14' and polysilicon layer 13' are etched by applying a photo etching method, thereby forming gate (electrode) 13 over which is oxide layer 14.

As illustrated in FIG. 1C, an ion-implantation (phosphorus ion) is carried out on the whole surface with a light dose and with a low implanting energy to form n⁻ region 101.

As illustrated in FIG. 1D, silicon oxide layer 15 is deposited on the whole surface by applying a chemical vapor deposition method (CVD) in order to form side wall spacers.

Thereafter, as illustrated in FIG. 1E, the whole surface is etched back by applying a reactive ion etching (RIE) process so that a part of silicon oxide layer 15 remains on the side faces of cap gate oxide layer 14 and gate 13. In this process, gate insulating layer 12 which is not protected by the gate also is etched, thereby exposing the surface of the silicon substrate. Thus, side wall spacer 15' consisting of a part of silicon oxide layer 15 and a part of gate insulating layer 12 is formed on the side walls of cap gate oxide layer 14 and gate 13.

Thereafter, as illustrated in FIG. 1F, an n-type dopant ion implantation is carried out with a large dose, thereby forming source/drain region 102 doped (n⁺) with a high concentration and having a deep junction. Under this condition, gate side wall spacer 15' plays the role of a barrier during the high concentration ion implantation for forming the source/drain region. Therefore, n⁻ junction 101', which is not affected by the high concentration doping, is formed between channel C of the gate and source/drain region 102. (Refer to Paul J. Tsang et al, "Fabrication of High Performance LDDFET's with Oxide Sidewall-Spacer Technology" IEEE Transactions on Electron Devices, Vol. ED29, No. 4, April 1982).

There are, however, several problems in forming LDD devices by providing gate side wall spacers. Particularly, this technology is not suitable for future formation of semiconductor devices requiring high density and high quality.

In this technique, in order to form a gate side wall spacer, deposition of an oxide is carried out by applying a CVD method, followed by an etch-back. Therefore, during this etching, the active region of the silicon substrate is exposed, and contaminated. Further, the active region of the silicon substrate is over-etched, thereby damaging the silicon substrate. Further, the over-etched depth is not uniform over the positions of the silicon wafer in accordance with the density of the patterns and, therefore, the electrical characteristics of the semiconductor device become non-uniform.

That is, as illustrated in FIG. 2, plasma radical species such as CF3, CHF3 and $O_2$ used during the etching of the oxide layer intrude into the silicon substrate. Therefore, although varying depending on the RF power during etching, a compound layer of about 500 Å is formed, the compounds including $CF_x$-polymers, Si—C, Si—O, Si—O—C.

FIG. 2 is a graphical illustration of the results of analysis using a secondary ion mass spectroscopy (SIMS) for the case where the plasma radical species intrude into the silicon substrate to contaminate the substrate during the etching of the oxide layer by using CF3, CHF3, $O_2$ and the like based on the conventional technique.

In the graph, the X axis illustrates the depth from the silicon surface, i.e., the value of the projection range as against the sputtering time, while the Y axis illustrates the concentration without unit in relative terms and in a logarithmic value. As can be seen from the graph, the concentrations of fluorine, oxygen and carbon near the surface of the silicon are higher than the concentration of the silicon and, therefore, these elements form a compound layer of about 500 Å from the surface, the compounds being such as $CF_x$-polymers, Si—C, Si—O, and Si—O—C.

In high density devices requiring a shallow junction, the bonding sites of the above-mentioned compounds exist within a depletion region when power is applied to the junction. Therefore, such bonding sites serve the role of a trap center for generating carriers, resulting in an increase in junction leakage current.

These findings are disclosed in Jeong Kim et al., "Cleaning Process for Removing of Oxide Etch Residue," Proceedings of Contamination Control and Defect Reduction in Semiconductor Manufacturing I, pp. 408–415, 1992, Toronto, and are summarized in FIG. 3 and FIG.4 (table 4.)

FIG. 3 is a graphical illustration of the variation of the lifetime of minority carriers (a time during which the minority carriers exist in silicon) according to etch processes of the side wall oxide. As illustrated in FIG. 3, the lifetime of the minority carriers are recovered to the original state of the silicon wafer, that is, about 100 $\mu$s, similar to the value before etching it. In FIG. 3, the "a" point indicates a lifetime (minority carrier lifetime) in the raw wafer itself (substrate) prior to etching the oxide side wall process. The "d" point indicates a lifetime in the wafer after etching the oxide side wall process by an RIE (reactive ion etch), thus receiving damage. The "b" point indicates a lifetime in the wafer in which the damaged portion is removed by an RIE process. The "c" point indicates a lifetime in the wafer in which the damaged portion is removed by a CDE (low damage Chemical Dry Si substrate Etch) process. The minority carrier lifetime is reduced to about 10 $\mu$s ("d" point) just after the etch of the oxide to form the side wall spacer. The damaged substrate is restored to over 100 $\mu$s ("c" point) by carrying out a low damage chemical dry etch. Further, if the damaged substrate is removed by a reactive ion etch (RIE), then the lifetime is improved to over 50 $\mu$s ("b" point). That is, if the damaged or contaminated portions are removed, the quality of the silicon substrate is restored to the original level.

FIG. 4 illustrates the dependence of junction leakage current on cleaning methods during formation of the gate side wall spacer. As can be seen from FIG. 4, if the silicon substrate is excessively etched, the damaged region increases, and, therefore, junction leakage also increases. If the etch-damaged or contaminated portions are removed, however, the junction characteristics are improved. In other words, in conventional technology in order to make the junction area beside the gate side wall free from damage, an over etch and low damage chemical dry etch process is required.

There is another problem with the conventional technique. Junction leakages were caused by dislocation lines which are across the junction layer from the side wall edge in MOS devices with an LDD structure.

As illustrated in FIG. 5, the gate side wall spacer is generally formed almost vertical relative to the silicon substrate and, therefore, the stress is concentrated on the corner where the side wall spacer meets the silicon substrate. Therefore, as indicated by dislocation line 555, which is formed from the corner of the spacer to the bulk of the substrate, a crystal defect is formed. This dislocation line increases the leakage current of the junction, and the data retention property is aggravated.

FIG. 5 is a sectional view of a MOSFET having an LDD structure and a silicon dioxide gate side wall spacer in the conventional semiconductor device.

Dislocation loops 500 and 501 which are formed during an $As^+$ ion implantation and subsequent annealing appear on silicon substrate 50 in the form of a loop. Crystal defect 500 of the upper layer is positioned at the depth center $R_P$ of the impurity ions, while crystal defect 501 of the lower layer is positioned at a boundary depth between the non-crystalline and crystalline portions. Particularly, stress generated by differences in thermal properties is concentrated on the corners of side wall spacer 55 of gate 53, with the result that a crystal defect is generated as indicated by dislocation line 555.

It is predicted that such a crystal defect is caused when the thermal stress becomes larger than the silicon bonding energy. Therefore, as illustrated in FIGS. 6A and 6B, the distribution of the stress becomes different in accordance with the shape of the gate side wall spacer.

FIGS. 6A and 6B illustrate the stress distribution from the gate side wall spacer to the silicon substrate of an NMOSFET having an LDD in a conventional semiconductor device.

Referring to FIG. 6A, a crystal defect in impurity diffusion layers 600 and 601 results from side wall spacer 65 due to the difference between the thermal expansion rates of silicon substrate 60 and gate side wall oxide layer 65. When the steeply shaped side wall is formed, the stress is concentrated at the side wall edge and indicates a value of about $5.4 \times 10^9$ dyn/cm$^2$. This stress exceeds the bonding energy of the crystal, thereby leading to defect "S" in FIG. 6A. That is, the magnitude of the stress becomes larger than the silicon bonding energy, with the result that dislocation "S" occurs.

Referring to FIG. 6B, if the side wall spacer is less steeply shaped, the stress is concentrated at the side wall edge and indicates a value of about $2.7 \times 10^9$ dyn/cm$^2$. Thus a defect depicted "S'" in FIG. 6B occurs only a little. Here also side wall spacer 65' at gate 63' affects diffusion layers 600' and 601' due to thermal expansion differences between silicon substrate 60' and gate side wall oxide layer 65'.

In short, the stress imposed on the silicon substrate is varied within the range of about $2.7 \times 10^9$–$5.4 \times 10^9$ dyn/cm$^2$ in accordance with the shape of the gate side wall spacer and the angle between the spacer and the substrate. The steeper the side wall spacer relative to the substrate, the more frequent the crystal defect, i.e., the more frequent the dislocation. (Refer to Shigeo Onishi et al., "Formation of a Defect Free Junction Layer by Controlling Defects Due to $As^+$ Implantation" IEEE/ERPS, 1991, pp. 255–259.)

FIG. 8 is a graphical illustration of the junction leakage current versus dislocation depth in the side wall spacer.

The X axis illustrates the depth of the dislocation line based on the profile of the conventional gate side wall spacer, while the Y axis illustrates the magnitude of the leakage current. It is seen that the greater the steepness of the side wall spacer, the greater the leakage current.

As the size of the device is scaled down, the acceptable tolerance is reduced. Therefore, there are still unsolved problems in that plasma species intrude into the substrate during deposition of the oxide layer based on a CVD process (which is the critical step in the formation of the gate side wall spacer), and during the etching due to the over-etch. Another problem is the degradation of the device characteristics (such as leakage current at the junction layer) due to the crystal defect such as dislocations attributed to the profile of the side wall spacer. Therefore, a study is being carried out for improving the manufacturing process for an LDD device utilizing a conventional side wall spacer.

Also another study is being carried out for obtaining a solution to the problems of forming an LDD device utilizing the side wall spacer based on a substitution method.

FIGS. 7A to 7C illustrate an improvement of the conventional technique of forming an LDD transistor by adding an etch stop layer and utilizing a side wall spacer.

As illustrated, gate 73 is patterned, and etch stop layer 777 (polysilicon or Si3N4) is formed on gate insulating and pad oxide layer 72 to protect silicon substrate 70 during etchback of CVD $SiO_2$ for forming side wall spacer 75. Then CVD $SiO_2$ 75 is deposited and etched back, so that an excessive etch of the silicon substrate and contamination of the etchant with plasma species are prevented. In the last step illustrated in FIG. 7C, in order to form a highly doped impurity region $n^+$, an ion implantation is carried out after removing spacer 75.

This conventional technique, however, cannot give a solution to the problem of the defect of crystal dislocation which is caused by the profile of the side wall spacer.

Another method suggested in U.S. Pat. No. 4,599,118 is an overhang technique where a stacked structure of $SiO_2$/Si3N4/polysilicon/$SiO_2$ is gate-patterned and the polysilicon is excessively etched, thereby forming an $SiO_2$/Si3N4 overhang. An $As^+$ source/drain ion implantation is carried out using the overhang as an ion implantation mask, and the overhang is removed in order to carry out an $n^-$ ion implantation for forming an $n^-$ region.

In brief, the scaled-down transistors come to have short channels, with the result that hot carriers are produced, thereby raising the problem of hot carrier instability. In order to overcome this problem, a transistor having an LDD has been proposed, and in the practical fields, the LDD was formed utilizing a gate side wall spacer. In high density devices of over 16 mega-bit DRAMs, however, the LDD device formed by utilizing a side wall spacer has become unsuitable for the reasons cited above.

SUMMARY OF THE INVENTION

According to the present invention, a MOSFET with an LDD structure is formed without a side wall spacer, thereby solving problems caused by the side wall spacer.

It is an object of the present invention to provide a process for forming a MOS semiconductor device having an LDD structure which is suitable for a VLSI (very large scale integrated circuit), and in which the above described disadvantages of the conventional techniques are overcome.

In the present invention, the LDD structure is formed without using a side wall spacer as an ion implantation inhibition layer.

A process in accordance with the present invention includes forming a gate electrode by first etching a conductive layer to a certain depth by an RIE process and by second etching the conductive layer to the end point by an isotropic plasma etching process. In forming the source/drain of the device, an $n^+$ source/drain and an $n^-$ source/drain are formed in a sequential manner.

In achieving the above object, a process for forming a MOS transistor having an LDD structure for solving the problem of the hot carrier effect with a short channel includes the steps of: (a) forming a gate insulating layer on a semiconductor substrate; (b) forming a gate electrode conductive layer on the insulating layer; (c) forming an etch inhibiting layer for forming a gate line with its width over-sized compared with its channel length, the etch inhibiting layer being for removing the conductive layer; (d) carrying out a first etching to a certain thickness for forming an over-sized gate electrode; (e) carrying out a second etching to form an over-sized gate electrode; (f) carrying out a first ion implantation to form a first impurity buried layer at the predetermined position in the exposed semiconductor substrate for forming a source/drain region (a self-aligned source/drain is formed by the over-sized gate electrode); (g) removing the etch inhibition layer; (h) forming an oxide layer on the surface of the over-sized gate electrode; (i) removing the oxide layer to form the final gate electrode; (j) carrying out a second ion implantation to form a second impurity buried layer on the semiconductor substrate for forming an LDD; (k) forming an insulating layer on the whole surface of the device for protecting the surface of the device; and (l) carrying out a heat treatment on the semiconductor substrate to form an LDD and a source/drain junction.

In achieving the above object, the process for forming a MOS transistor having an LDD structure according to the present invention can also include the steps of: (a) forming a first insulating layer upon a semiconductor substrate; (b) forming a gate electrode conductive layer on the first insulating layer; (c) carrying out a first etching to make an over-sized gate remain in the form of a conductive layer and another part of the conductive layer; (d) carrying out a second etching on the remaining conductive layer to form the over-sized gate; (e) carrying out a first ion implantation on the whole surface; (f) carrying out an anisotropic etching on the over-sized gate to make the corners of the gate round so as to form a reduced final gate; (g) carrying out a second ion implantation for forming an LDD; (h) forming a second insulating layer on the exposed surface of the first insulating layer and on the face and side of the final gate; and (i) carrying out an annealing on the whole surface.

BRIEF DESCRIPTION OF THE DRAWINGS

The above object and other advantages of the present invention will become more apparent by describing in detail the preferred embodiments of the present invention with reference to the attached drawings in which:

FIG. 2 is a graphical illustration of the results of an analysis of an over-etched silicon substrate using SIMS (secondary ion mass spectroscopy) and illustrating the contamination of the silicon substrate by the intruding plasma radicals during the etch of the oxide layer using gases of CF3, CHF3, $O_2$ and the like;

FIG. 3 is a graphical illustration of the variation of the lifetime of the minority carriers according to various etch processes of the side wall oxide;

FIG. 4 is a table illustrating the dependence of junction leakage current on various cleaning methods during formation of the gate side wall spacer;

FIG. 5 is a partly sectional view of an NMOSFET having an LDD structure in a conventional semiconductor device;

DESCRIPTION OF THE PREFERRED EMBODIMENTS

FIGS. 9A to 9G illustrate a process for forming an LDD structure for a MOS device according to the present invention.

Figure 1A:
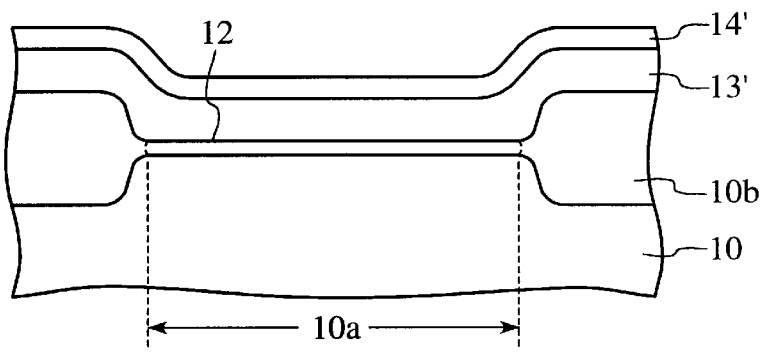
FIG. 1 illustrates a process for formation of an NMOS transistor having an LDD structure based on a conventional technique.
Figure 1B:
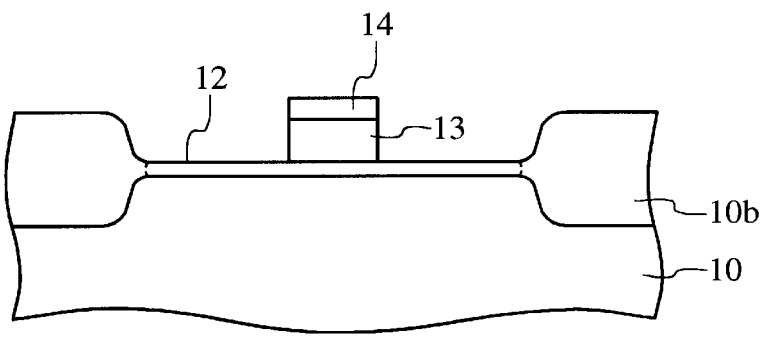
Figure 1C:
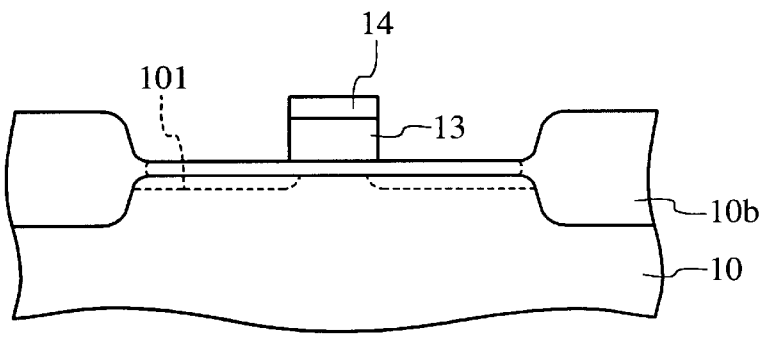
Figure 1D:
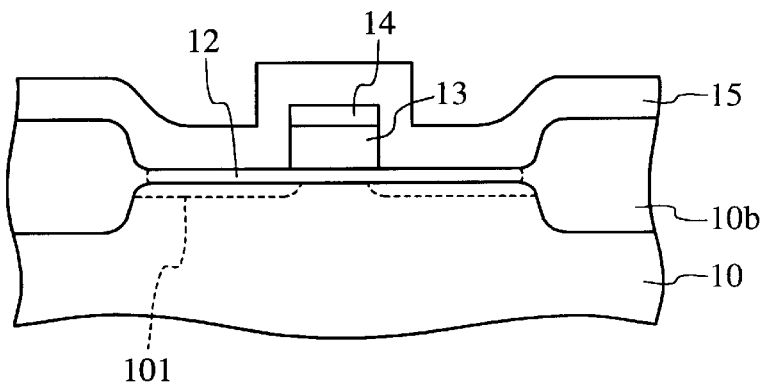
Figure 1E:
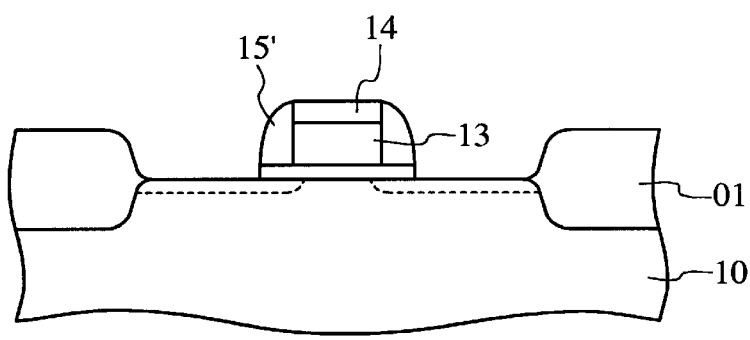
Figure 1F:
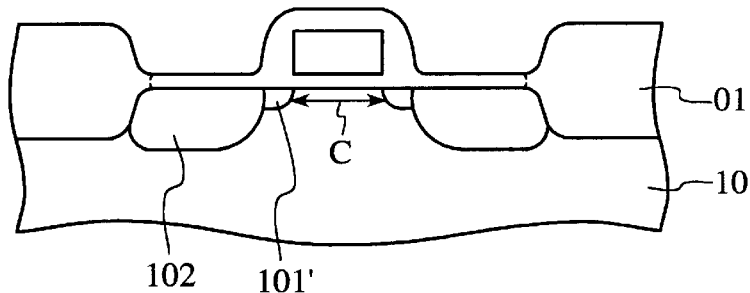
Figure 2:
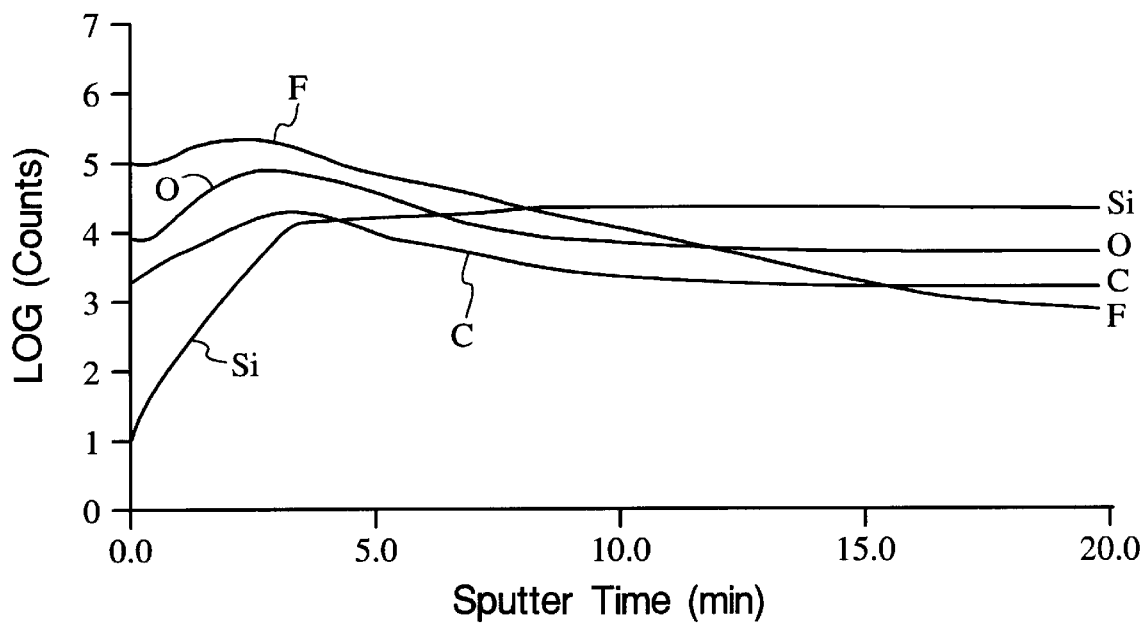
Figure 6A:
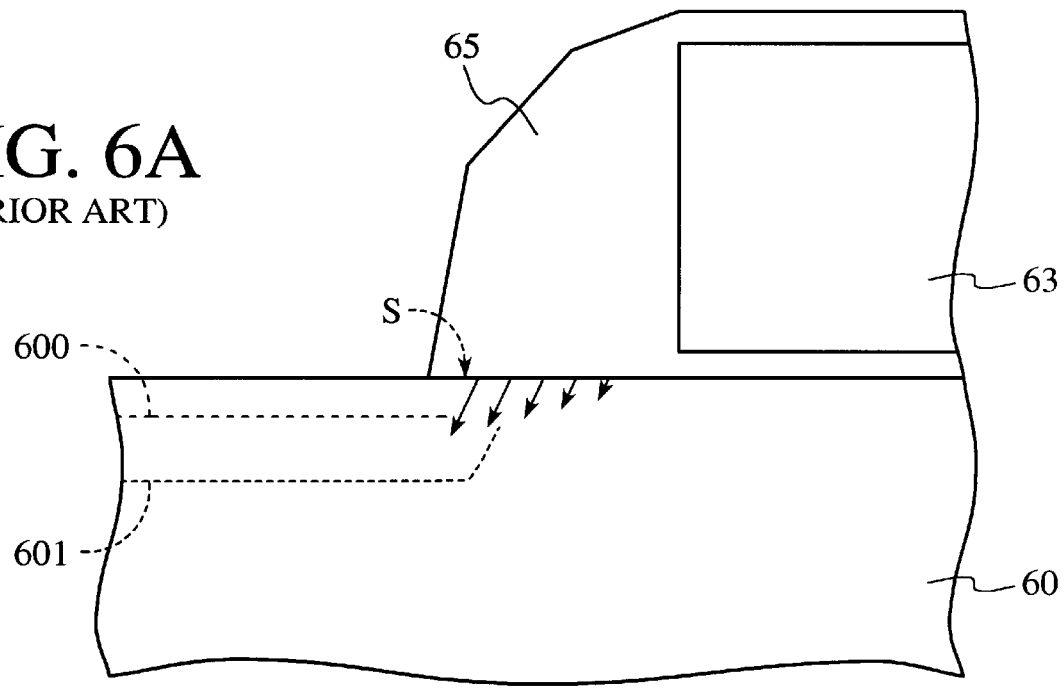
FIG. 6 illustrates the distribution of the stress from the gate side wall to the silicon substrate for an NMOSFET having an LDD structure in a conventional semiconductor device.
Figure 6B:
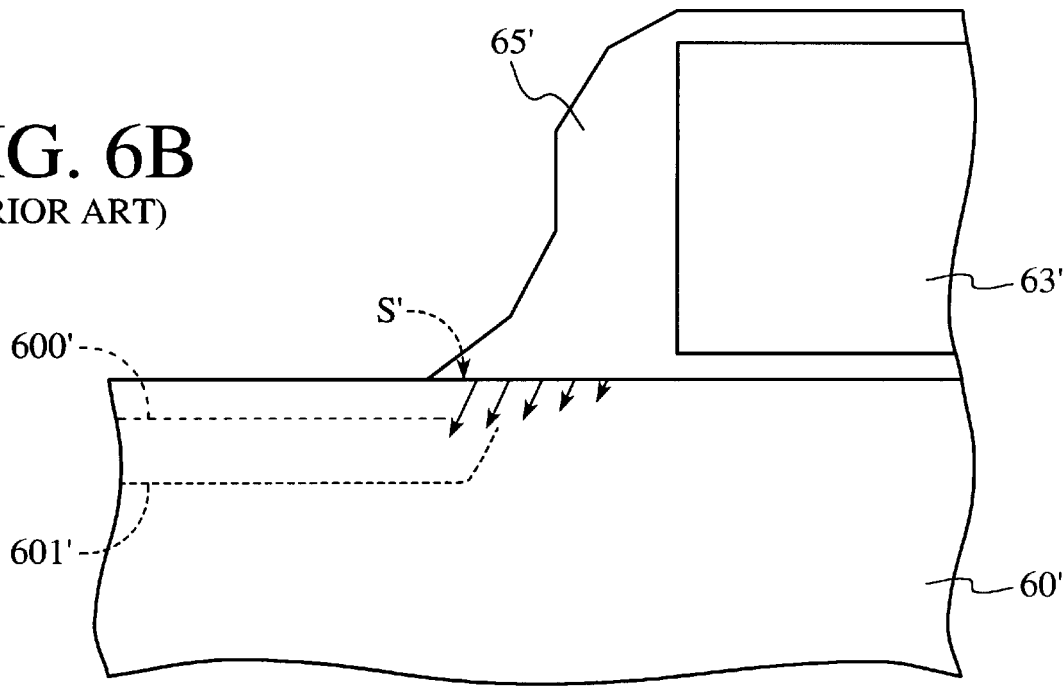
Figure 7A:
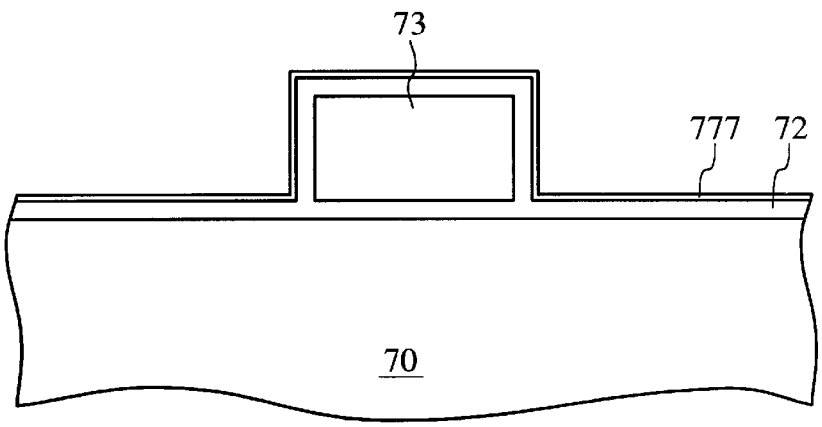
FIG. 7 illustrates a process for formation of an LDD transistor using a side wall spacer and adding an etch stop layer as an improvement of the conventional techniques.
Figure 7B:
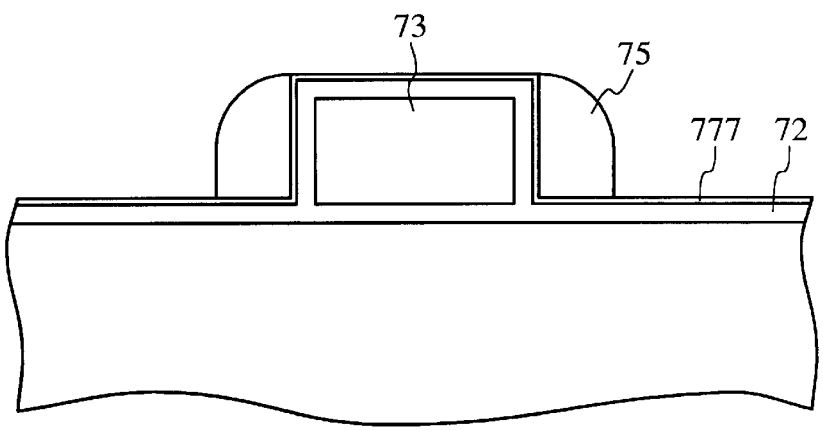
Figure 7C:
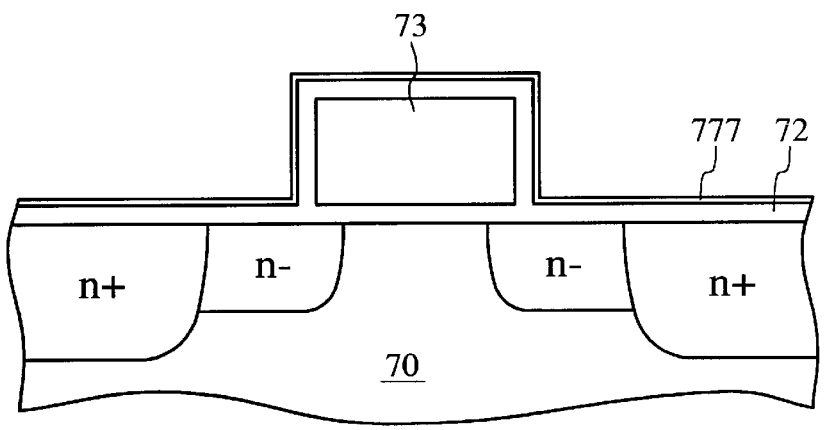
Figure 8:
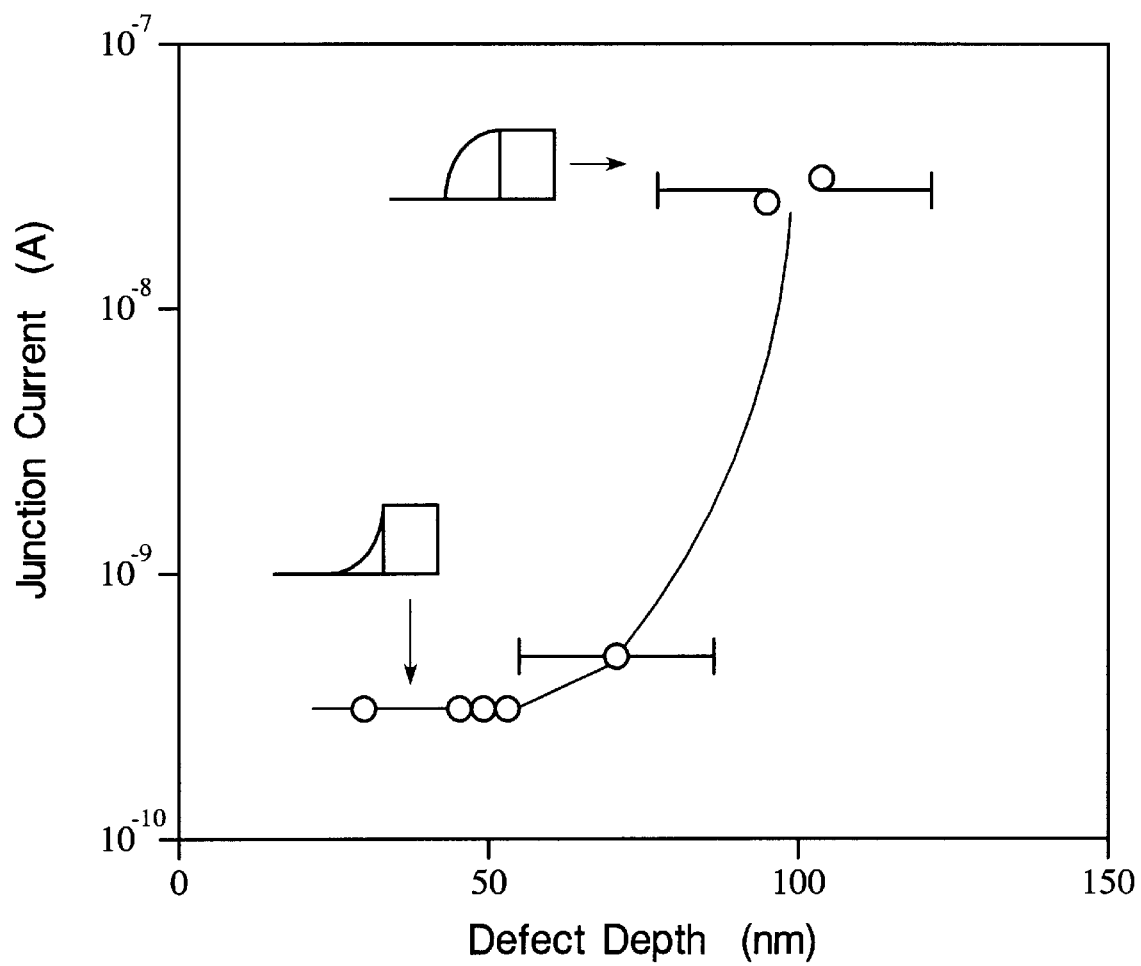
FIG. 8 illustrates junction leakage current versus the dislocation line depth in the substrate.
Figure 9A:
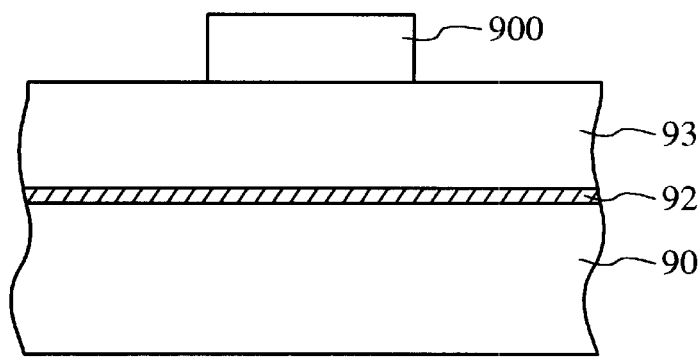
FIGS. 9A to 9G are partly sectional views illustrating the process for forming a MOS field effect transistor having an LDD structure according to the present invention.

As illustrated in FIG. 9A, an n-well/p-well is formed on p-type silicon wafer 90. An oxide layer ($SiO_2$) is grown to a thickness of about 100 Å within an oxidation furnace to form gate insulating layer 92 (first insulating layer). Polysilicon layer 93 which is doped with phosphor ions and which is to become a gate electrode is deposited to a thickness over about 2500 Å on gate insulating layer 92 by applying an LPCVD (low pressure chemical vapor deposition) process.

Assuming that the actual device channel length is designed to be about 0.5 μm, the channel length in the manufacturing process is given a symmetrical over-size of about 0.14 μm, thereby forming a rough gate electrode (having a width of about 0.78 μm).

For this, photo resist is spread on doped polysilicon layer 93, and photo resist pattern 900 is defined by exposing and developing using an over-sized mask and applying a photo lithography method.

Figure 9B:
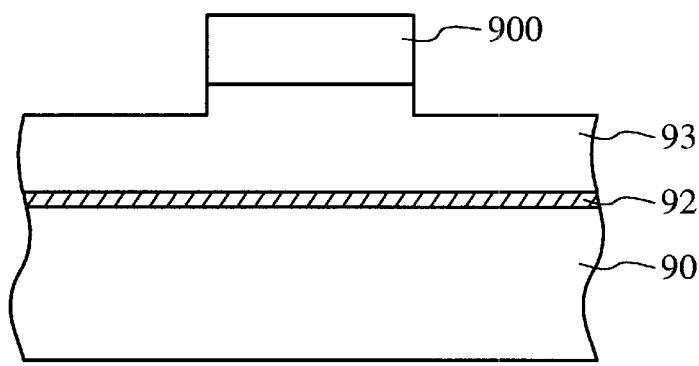

As illustrated in FIG. 9B, a first etching is carried out for forming a gate electrode. This etching is carried out in such a manner that a plasma anisotropic etching is utilized using a chlorine compound gas as the reaction source in a general RIE (reactive ion etching) system, thereby etching polysilicon layer 93 down to a depth of about 1200 Å.

Figure 9C:
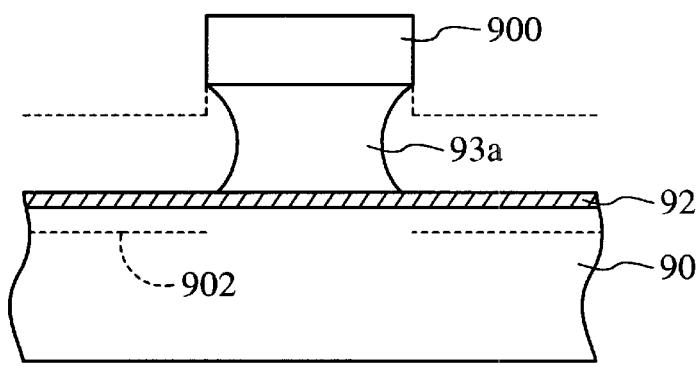

As illustrated in FIG. 9C, a second etching is carried out for forming the gate. That is, a remote plasma chemical dry etching method, which is strongly isotropic, is used (for example, a TA 2500 model apparatus of the TOK company of Japan may be used) to carry out 100% isotropic etching by means of a fluorine series plasma. Thus, the remaining polysilicon, which has a thickness of about 1300 Å, and which is not protected by the remaining photo resist 900, is removed. Under this condition, the polysilicon layer which is to become the gate electrode is protected by the photo resist, but the sides of the remaining polysilicon layer is recessed in concave form, with the result that over-sized preliminary gate electrode 93a is formed.

A first ion implantation is carried out using $As^+$ ions as the impurity for forming a highly doped $n^+$ source/drain junction. The ion implantation conditions are an impurity ion concentration of about $5.0 \times 10^{15}$ ions/cm$^2$ and an acceleration energy of about 40 keV. Under these conditions, photo resist pattern 900 for forming the gate, which is symmetrically over-sized by about 0.14 μm, serves as an ion implantation inhibiting layer, and automatically aligns doped region 902, which is to be formed into an $n^+$ source/drain.

Figure 9D:
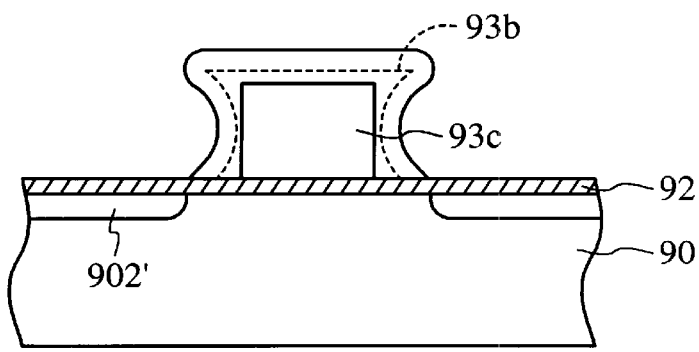

As illustrated in FIG. 9D, the photo resist which was used in forming the first preliminary gate electrode is removed by dipping into an $H_2SO_4/H_2O_2$ solution. First preliminary gate electrode 93a is oxidized in an oxidation furnace, so that an oxide ($SiO_2$) layer as second insulating layer 93b is grown to a thickness of about 200 Å on electrode 93a. Under this condition, the oxide layer is grown isotropically and, therefore, polysilicon layer 93c of final gate electrode 93c is preserved, so that the over-sized form be oxidized until the dimension of final gate 93c is attained.

Further, during the thermal oxidation within the oxidation furnace, a diffusion of the impurity of the first ion implantation occurs, with the result that highly doped n type source/drain junction 902' is formed.

Figure 9E:
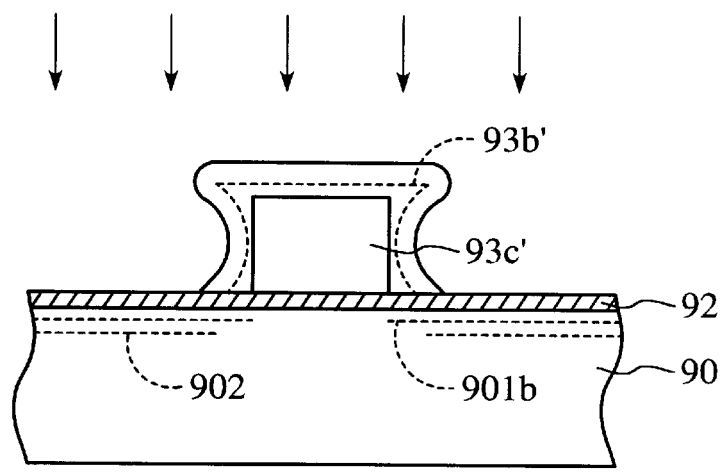
Figure 9F:
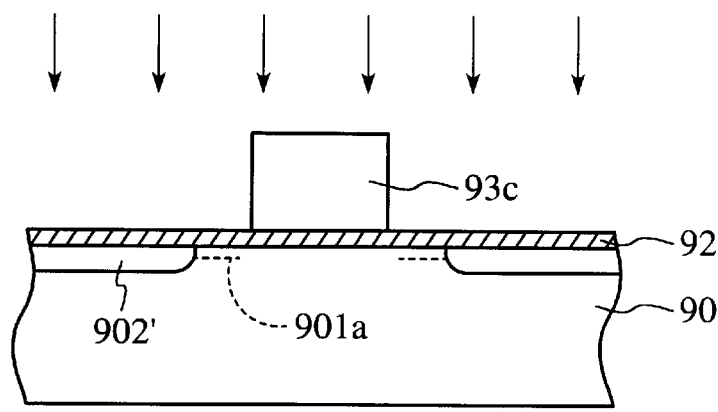

As illustrated in FIG. 9F, oxide layer 93b which is the second insulating layer is removed by a wet etching process to a target thickness of about 200 Å using a diluted HF solution. Thus, final gate electrode 93c of polysilicon is completely formed.

A second ion implantation is carried out to form an $n^-$ region, i.e., an LDD structure. In this process, the ion implantation conditions are an ion implantation concentration of about $2.4 \times 10^{13}$ ions/cm$^2$ of phosphor ions and an acceleration energy of about 30 KeV. Thus, lightly doped buried layer 901a is formed in silicon substrate 90.

As another embodiment, after etching first preliminary gate 93a by isotropic etching as in the step of FIG. 9C, other steps are carried out in the following manner.

That is, as illustrated in FIG. 9E, photo resist pattern 900 is removed, and tip 93b' of the corners of first preliminary gate electrode 93a' are etched by applying a general RIE polysilicon etching method to remove it, with the result that final gate 93c' having the actual dimensions is completed. At this stage, however, the diffusion of the impurity ions of the first ion implantation has not occurred, and, therefore, the highly doped source/drain is not completed, but remains as a buried layer 902.

As illustrated in FIG. 9E, a second ion implantation is carried out for forming the LDD structure, thereby forming a lightly doped ion buried layer 901b.

Figure 9G:
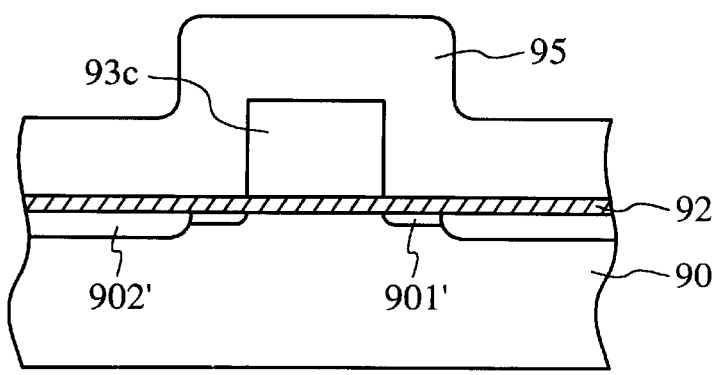

As illustrated in FIG. 9G, third insulating layer 95 ($SiO_2$) is deposited on the whole surface by applying a CVD method. An annealing is carried out at a temperature of about 870° C., thereby forming a junction of LDD structure 901' and source/drain 902'. Thus, the MOSFET of the present invention is completed.

Additionally, those skilled in the art will know that the conception of the present invention is not limited to the formation of the LDD structure, but also extends to reducing polysilicon in the general process. This method will be described additionally as follows. The method of reducing the gate of a semiconductor device includes the steps of: (1) forming an insulating layer on a semiconductor substrate; (2) forming a gate conductive layer on the insulating layer; (3) forming an etch inhibition layer for forming an over-sized gate (over-sized compared with the final gate) and for removing certain portions of the conductive layer; (4) carrying out a first etching using the etch inhibiting layer for forming the over-sized gate to remove the gate conductive layer to a certain thickness; (5) carrying out a second etching to form the over-sized gate electrode; (6) removing the etch inhibiting layer for forming the over-sized gate line; (7)

forming an oxide layer on the surface of the over-sized gate electrode; and (8) removing the oxide layer to form a final gate electrode.

According to the present invention as described above, the problems in forming the LDD device based on a side wall spacer method (after CVD $SiO_2$ deposition) are solved. That is, the problems arising during the formation of the side walls such as non-uniform over-etching of the substrate, the contamination of the substrate due to the intrusion of the plasma species, and the consequent junction leakage current, are solved. Further, there is inhibited the dislocation line which grows from the corners of the spacer to the bulk of the substrate due to the stress and due to the profile of the gate side wall spacer. This gives the solution to the problem of the leakage current. Thus, the present invention provides a process for formation of a MOS device having an LDD structure, which satisfies the electric characteristics required by a high density IC.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A process for forming a MOS transistor having an LDD structure with at least a first impurity region and a second impurity region formed in a semiconductor substrate and a gate electrode of a first width, wherein the first impurity region has a higher inpurity concentration than the second impurity region and is spaced apart from a side of the gate electrode, the process comprising the steps of:
   (a) forming an insulating layer on the semiconductor substrate;
   (b) forming a conductive layer having a thickness on the insulating layer;
   (c) forming an etch inhibition pattern on the conductive layer, wherein the etch inhibition pattern has a width greater than the first width;
   (d) carrying out an anisotropic etching on the conductive layer using the etch inhibition pattern as a mask to remove a portion of the thickness of the conductive layer;
   (e) carrying out an isotropic etching on the anisotropically etched conductive layer to form a gate electrode pattern, wherein the gate electrode pattern has concave sides and an upper portion of a second width greater than the first width;
   (f) carrying out a first ion implantation for forming the first inpurity region in the semiconductor substrate, wherein the etch inhibition pattern and the gate electrode pattern having the upper portion of the second width are used as a first mask;
   (g) removing the etch inhibition pattern after the first ion implantation;
   (h) oxidizing e gate electrode pattern to form an oxide layer on the gate electrode pattern;
   (i) removing the oxide layer for forming the gate electrode of the first width;
   (j) carrying out a second ion implantation for forming the second impurity region in the semiconductor substrate, wherein the gate electrode is used as a second mask; and
   (k) carrying out a heat treatment, wherein the LDD structure is formed.

2. The process of claim 1, wherein, after step (j), a second insulating layer is formed on the gate electrode and the semiconductor substrate.

3. The process of claim 1, wherein the insulating layer comprises a thermal oxide layer.

4. The process of claim 1, wherein the conductive layer comprises polysilicon.

5. The process of claim 1, wherein the anisotropic etching comprises reactive ion plasma etching.

6. The process of claim 1, wherein the isotropic etching comprises isotropic remote plasma chemical dry etching.

7. The process of claim 1, wherein the isotropic etching is carried out utilizing the insulating layer as an etch stop layer.

8. The process of claim 1, wherein the first ion implantation is carried out using $As^+$ ions and under conditions of a concentration of about $3.0$–$6.0 \times 10^{15}$ ions/cm$^2$ and an acceleration energy of about 20–50 KeV.

9. The process of claim 1, wherein the second ion implantation is carried out using phosphorus ions and under conditions of a concentration of about $2.0$–$3.0 \times 10^{12}$ ions/cm$^2$ and an acceleration energy of about 20–40 KeV.

10. A process for forming a transistor having an LDD structure with at least a first impurity region and a second impurity region formed in a semiconductor substrate and a gate electrode of a first width, wherein the first impurity region has a higher impurity concentration than the second impurity region and is spaced apart from a side of the gate electrode, the process comprising the steps of:
    (a) forming a first insulating layer on the semiconductor substrate;
    (b) forming a conductive layer having a thickness on the first insulating layer;
    (c) forming an etch inhibition pattern on the conductive layer, wherein the etch inhibition pattern has a width greater than the first width;
    (d) carrying out a first anisotropic etching on the conductive layer to remove a portion of the thickness of the conductive layer using the etch inhibition pattern as a mask;
    (e) carrying out an isotropic etching on the anisotropically etched conductive layer to form a gate electrode pattern using the etch inhibition pattern as a mask, wherein the gate electrode pattern has concave sides and an upper portion including a tip portion, the upper portion having a second width greater than the first width;
    (f) carrying out a first ion implantation in the semiconductor substrate for forming the first impurity region using the etch inhibition pattern and the gate electrode pattern as a first mask;
    (g) removing the etch inhibition pattern after the first ion implantation;
    (h) carrying out a second anisotropic etching on the gate electrode pattern for forming a gate electrode of the first width, wherein the tip portion of the gate electrode pattern is etched by the second anisotropic etching;
    (i) carrying out a second ion implantation in the semiconductor substrate for forming the second impurity region using the gate electrode as a second mask;
    (j) forming a second insulating layer on the first insulating layer and the gate electrode; and
    (k) carrying out a heat treatment for forming the LDD structure.

11. The process of claim 10, wherein the first insulating layer is formed to thickness of about 100 Å.

12. The process of claim 10, wherein the conductive layer is formed to a thickness over about 2500 Å using phosphorus ions and applying a low pressure chemical vapor deposition method.

13. The process of claim 10, wherein the first anisotropic etching comprises a plasma anisotropic etching using a chlorine compound gas in a reactive ion etching system.

14. The process of claim 10, wherein the isotropic etching comprises an isotropic etching using a fluorine series gas and an isotropic remote plasma chemical dry etching method.

15. The process of claim 10, wherein the conductive layer is formed to a thickness of over about 2500 Å and the first anisotropic etching etches about 1200 Å of the first conductive layer.

16. The process of claim 10, wherein, after the anisotropic etching step, the conductive layer remains to a thickness of about 1300 Å.

17. The process of claim 10, wherein the first insulating layer is used as an etch stop layer for the isotropic etching step.

18. The process of claim 10, wherein the second anisotropic etching is carried out by applying a general RIE polysilicon etching method.

19. The process of claim 10, wherein the heat treatment is carried out at a temperature of about 870° C.

* * * * *

UNITED STATES PATENT AND TRADEMARK OFFICE
CERTIFICATE OF CORRECTION

PATENT NO. : 5,840,611
DATED : November 24, 1998
INVENTOR(S) : Chang-Jae Lee; Jae-Jeong Kim It is certified that error appears in the above-identified patent and that said Letters Patent is hereby corrected as shown below:

Column 9, line 31, "inpurity" should be --impurity--;
Column 9, line 58, "e" should be --the--.

Signed and Sealed this

Twenty-third Day of March, 1999

Attest:

Q. TODD DICKINSON

*Attesting Officer*        *Acting Commissioner of Patents and Trademarks*